(12) United States Patent
Iwasaki et al.

(10) Patent No.: US 11,716,524 B2
(45) Date of Patent: Aug. 1, 2023

(54) IMAGE PICKUP APPARATUS

(71) Applicant: CANON KABUSHIKI KAISHA, Tokyo (JP)

(72) Inventors: Takafumi Iwasaki, Kanagawa (JP); Kentaro Watanabe, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/685,518

(22) Filed: Mar. 3, 2022

(65) Prior Publication Data
US 2022/0294957 A1 Sep. 15, 2022

(30) Foreign Application Priority Data
Mar. 9, 2021 (JP) .................. 2021-037727

(51) Int. Cl.
*H04N 23/52* (2023.01)
*G03B 17/55* (2021.01)
*H04N 23/54* (2023.01)
*H04N 23/68* (2023.01)
*H05K 7/20* (2006.01)
*H05K 1/02* (2006.01)

(52) U.S. Cl.
CPC ............ *H04N 23/52* (2023.01); *G03B 17/55* (2013.01); *H04N 23/54* (2023.01); *H04N 23/68* (2023.01); *H04N 23/687* (2023.01); *H05K 1/021* (2013.01); *H05K 7/2039* (2013.01); *H05K 7/20145* (2013.01); *G03B 2205/0038* (2013.01); *G03B 2205/0069* (2013.01)

(58) Field of Classification Search
CPC ........ H04N 23/52; H04N 23/54; H04N 23/68; H04N 23/687; G03B 17/55; G03B 2205/0038; G03B 2205/0053; G03B 2205/0061; G03B 2205/0069; G03B 2205/0076; G03B 2205/0084; H05K 1/0201–021; H05K 7/20; H05K 7/20145; H05K 7/2039; F28F 13/00
See application file for complete search history.

(56) References Cited

U.S. PATENT DOCUMENTS

| | | | | |
|---|---|---|---|---|
| 2013/0278820 A1* | 10/2013 | Lin | ........................ | H04N 23/51 348/374 |
| 2015/0358564 A1* | 12/2015 | Kang | ...................... | H01L 23/36 348/244 |
| 2018/0070003 A1* | 3/2018 | Ramseyer | .............. | H04N 23/90 |
| 2018/0302566 A1* | 10/2018 | Wada | ...................... | H04N 23/55 |
| 2021/0208418 A1* | 7/2021 | Liu | ........................ | H04N 23/54 |

FOREIGN PATENT DOCUMENTS

JP 2012-028940 A 2/2012

* cited by examiner

*Primary Examiner* — Twyler L Haskins
*Assistant Examiner* — Akshay Trehan
(74) *Attorney, Agent, or Firm* — Cowan, Liebowitz & Latman, P.C.

(57) ABSTRACT

An image pickup apparatus includes an image sensor unit that includes a fixed unit and a movable unit movable relative to the fixed unit, and a duct unit configured to form an air channel. The movable unit includes an image sensor and a heat exchanger. At least part of the heat exchanger is inserted inside the duct unit through an opening of the duct unit.

14 Claims, 11 Drawing Sheets

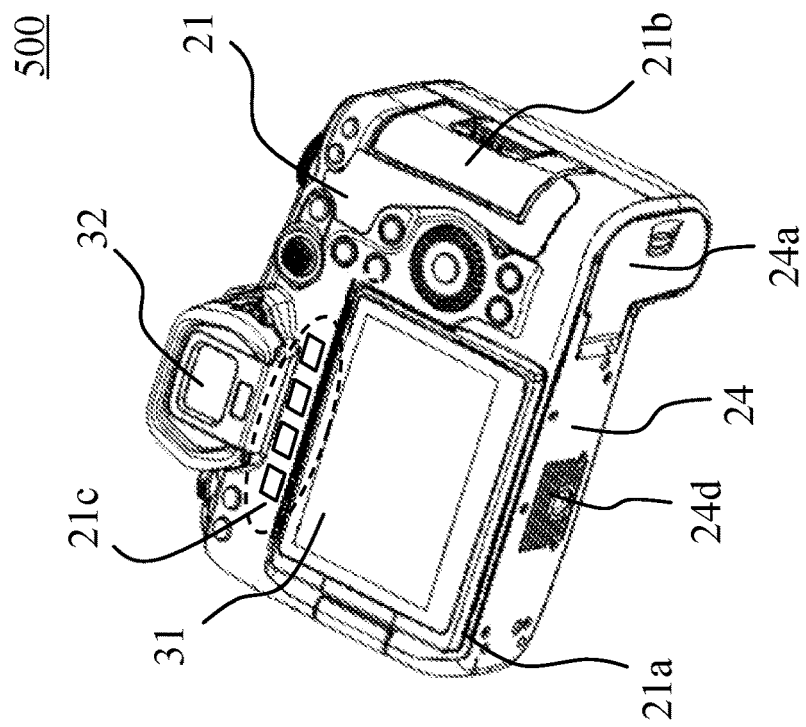
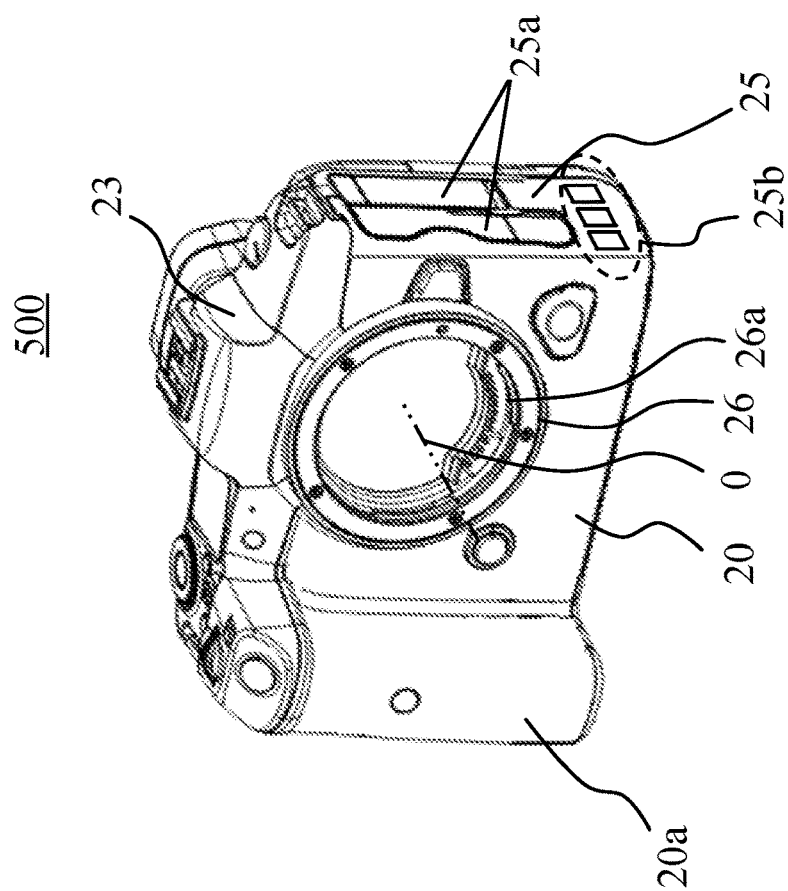
FIG. 1B
FIG. 1A

OPTICAL AXIS 0

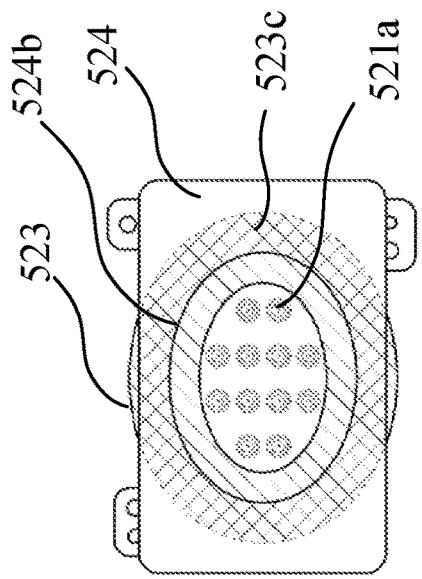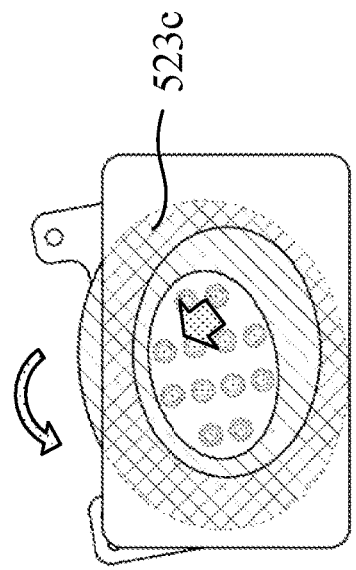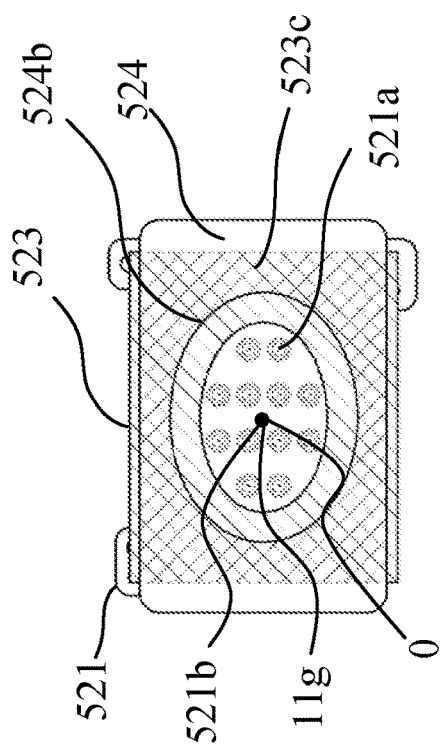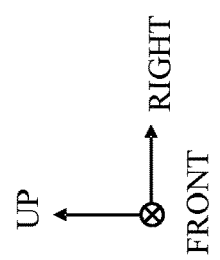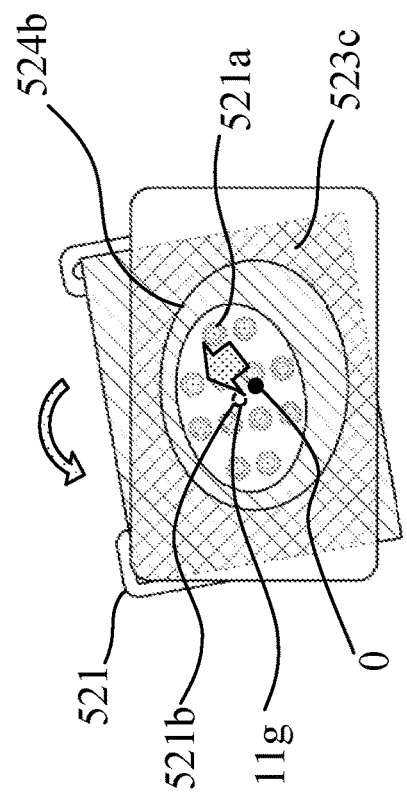
FIG. 13A
FIG. 13B
FIG. 13C
FIG. 13D

IMAGE PICKUP APPARATUS

BACKGROUND OF THE INVENTION

Field of the Invention

The present invention relates to an image pickup apparatus.

Description of the Related Art

In order to improve the image quality, one conventional image pickup apparatus performs optical image stabilization by moving an image sensor (image pickup element) in a direction orthogonal to an optical axis. The image sensor is demanded for a sufficient heat radiating performance because the heat generated by the image sensor affects the image quality in the image stabilizing driving, continuous imaging, motion image capturing, and the like.

Japanese Patent Laid-Open No. ("JP") 2012-028940 discloses an image pickup apparatus in which a heat radiating sheet such as a graphite sheet is attached to a back surface of a device unit having an image sensor to improve the heat radiating performance. This structure reduces a moving load of the image sensor in a direction orthogonal to the optical axis.

In the structure disclosed in JP 2012-028940, a heat radiating amount of the heat generated from the image sensor is determined by the thickness and width of the heat radiating sheet connected to the image sensor. The heating value of the image sensor has increased due to recent improvements in the motion image performance of the image pickup apparatus. The structure disclosed in JP 2012-028940 has difficulty in sufficiently radiating the heating generated by the image sensor, and may not eliminate the temperature rise of the image sensor. On the other hand, if the thickness and width of the heat radiating sheet are increased in order to increase the heat radiating amount, the moving load of the image sensor increases.

SUMMARY OF THE INVENTION

The present invention provides an image pickup apparatus that can efficiently radiate heat generated by an image sensor movable in a direction orthogonal to an optical axis.

An image pickup apparatus according to one aspect of the present invention includes an image sensor unit that includes a fixed unit and a movable unit movable relative to the fixed unit, and a duct unit configured to form an air channel. The movable unit includes an image sensor and a heat exchanger. At least part of the heat exchanger is inserted inside the duct unit through an opening of the duct unit.

Further features of the present invention will become apparent from the following description of exemplary embodiments with reference to the attached drawings.

BRIEF DESCRIPTION OF THE DRAWINGS

FIGS. 1A and 1B are perspective views of a digital camera according to a first embodiment.

FIGS. 13A to 13D are structural diagrams of a heat exchanger, cooling fins, a first shielding member, and a second shielding member in the fourth embodiment.

DESCRIPTION OF THE EMBODIMENTS

Figure 2:
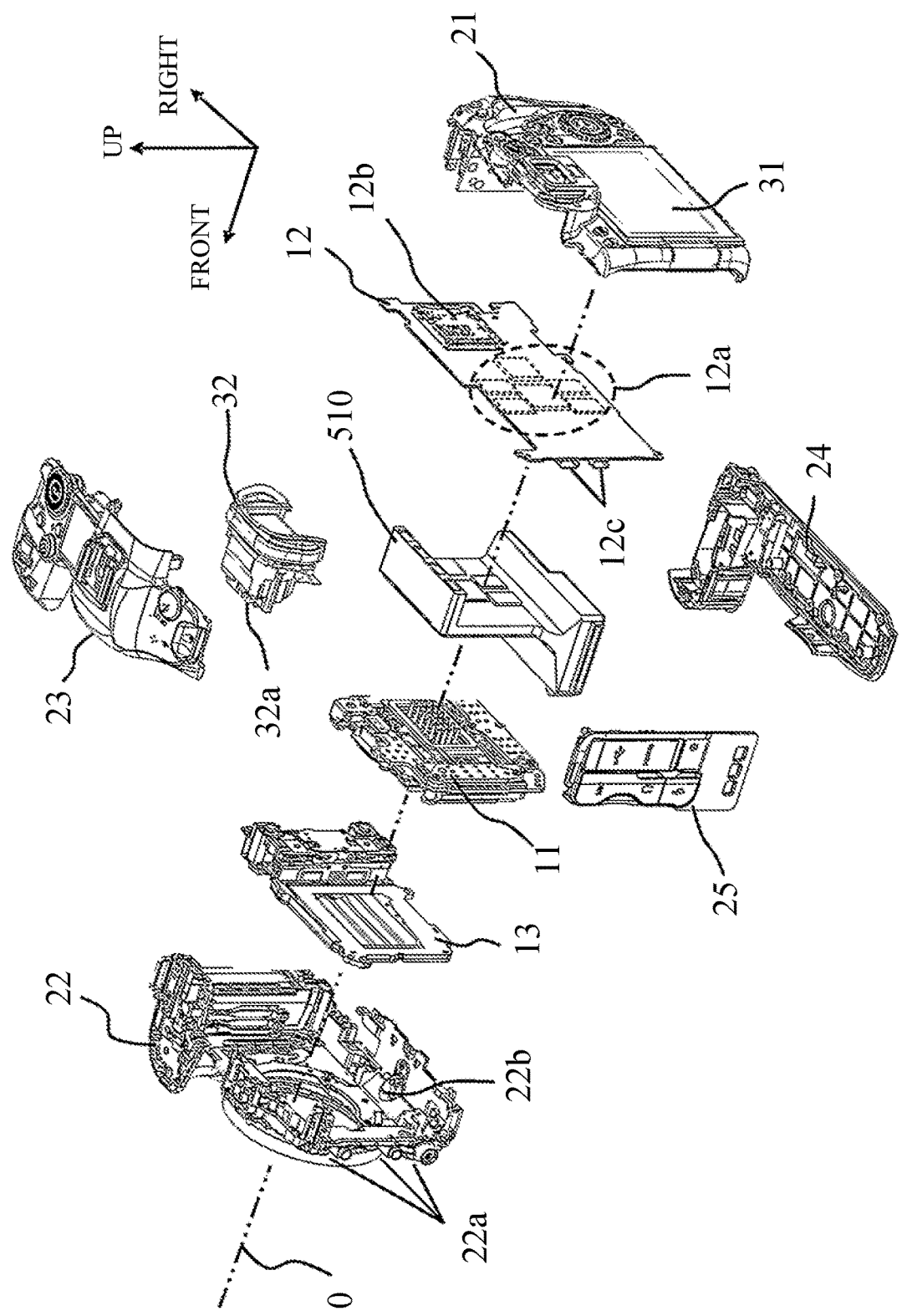
FIG. 2 is an exploded perspective view of a digital camera according to the first embodiment.

Referring now to the accompanying drawings, a detailed description will be given of embodiments according to the present invention.

First Embodiment

Referring now to FIGS. 1A and 1B, a description will be given of an external structure of a digital camera (image pickup apparatus) 500 according to a first embodiment of the present invention. FIG. 1A is a front perspective view of the digital camera 500, and FIG. 1B is a rear perspective view of the digital camera 500.

Various operating members for operating the digital camera 500 are attached to a rear cover 21. A description of members irrelevant to this embodiment, such as operating members and display members, will be omitted. The rear cover 21 has an inlet 21c for taking in air from a duct, which will be described below. A recording medium lid 21b is a cover for protecting the opening of a recording medium IF that houses a memory card for recording a captured image. A rear display unit 31 is disposed on the rear cover 21.

A rear display unit 31 can detect a touch operation on a display plane, and can display and set a preview image and various setting states. The rear display unit 31 is a so-called vari-angle type monitor that is rotatably attached to the digital camera 500, and stored in a display unit storage unit 21a provided on the rear cover 21. A front cover 20 is integrated with a grip unit 20a having a shape that makes it easy for the user to hold the digital camera 500 with his/her right hand. Various operating members for operating the digital camera 500 are attached to a top cover 23. A bottom cover 24 for protecting the bottom surface portion has a battery lid 24a through which a battery is detached and attached. A side cover 25 is formed with an outlet 25b for exhausting the duct described below. Terminal covers 25a are covers for protecting external communication terminals mounted on a main board (or substrate), which will be described below, for connecting a connection cable to an unillustrated external device.

An optical axis 0 is an axis that passes through the center of a mount 26. An unillustrated interchangeable lens is attached to and detached from the mount 26. Provided inside the mount 26 is a lens communication terminal 26a that provides electrical communication with the interchangeable lens.

Referring now to FIG. 2, a description will be given of an internal structure of the digital camera 500. FIG. 2 is an exploded perspective view of the digital camera 500. Arrows in FIG. 2 and subsequent figures illustrate directions for convenience in using the digital camera 500. As illustrated in FIG. 2, the digital camera 500 includes the rear cover 21, a front base 22, the top cover 23, the bottom cover 24, and the side cover 25. Provided inside the digital camera 500 are an image sensor unit 11 having an image stabilizing mechanism, a main board 12, a duct unit 510, a shutter 13, and a viewfinder 32.

The image sensor unit 11 includes a movable unit 11b including an image sensor 11a, and a fixed unit 11c. The main board 12 has control ICs (controller) 12a for controlling an imaging signal, a recording-medium connector 12b for housing an external recording medium, and external communication terminals 12c for connecting connection cables with external devices. The external communication terminals 12c are covered with the terminal covers 25a, as described above. The viewfinder 32 is provided with a viewfinder display unit 32a for displaying an image output from the image sensor unit 11. A centrifugal fan is built in the duct unit 510, and the flow of air is generated inside the duct unit 510. The image sensor unit 11 and the control ICs 12a are members of the digital camera 500 that consume particularly large power, have high heating values, and cause sharp temperature rises. The imaging time of the digital camera 500 is limited by the guaranteed operating temperature of each component. In order to maintain the imaging time as long as possible, it is necessary to cool the image sensor unit 11 and the control ICs 12a as heat sources so as to keep the guaranteed operating temperature.

Accordingly, this embodiment provides, as illustrated in FIG. 2, the duct unit 510 between the image sensor unit 11 including the image sensor and the main board 12 (so that the duct unit 510 is sandwiched between the image sensor unit 11 and the main board 12) as the heat sources. As will be described below, the control ICs 12a as the heat source of the main board 12 is thermally coupled to the duct unit 510. The image sensor unit 11 has a means for exchanging heat with airflow in the duct unit 510 to cool each heat source.

Figure 3A:
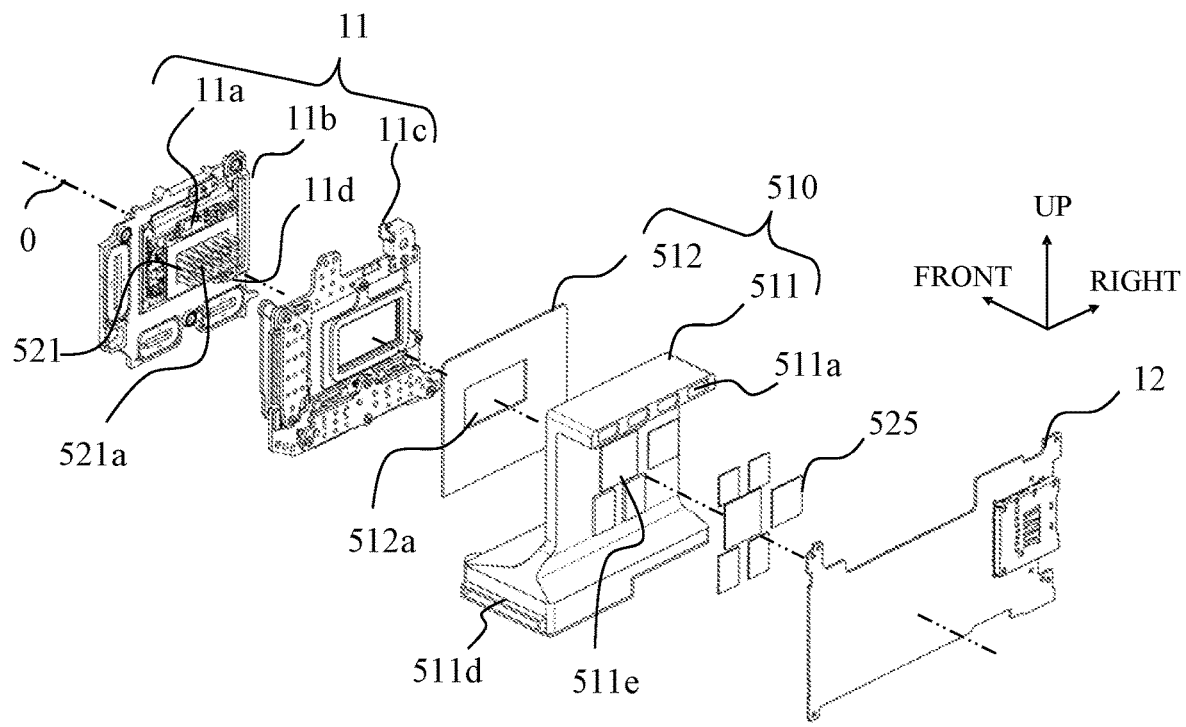
FIGS. 3A and 3B are exploded perspective views of an image sensor unit, a duct unit, and a main board according to the first embodiment.
Figure 3B:
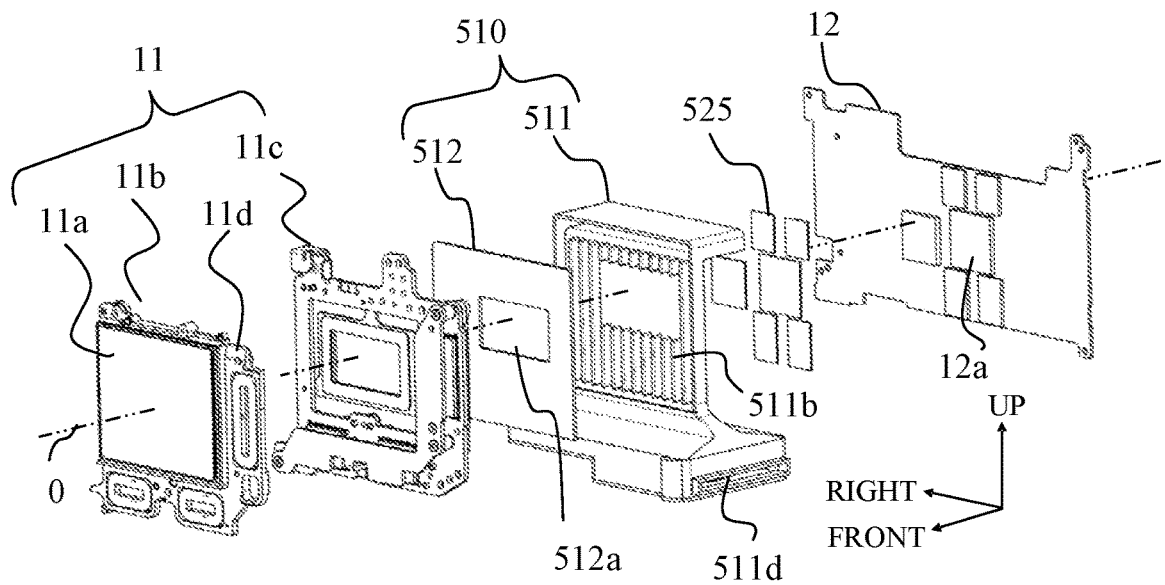
Figure 4:
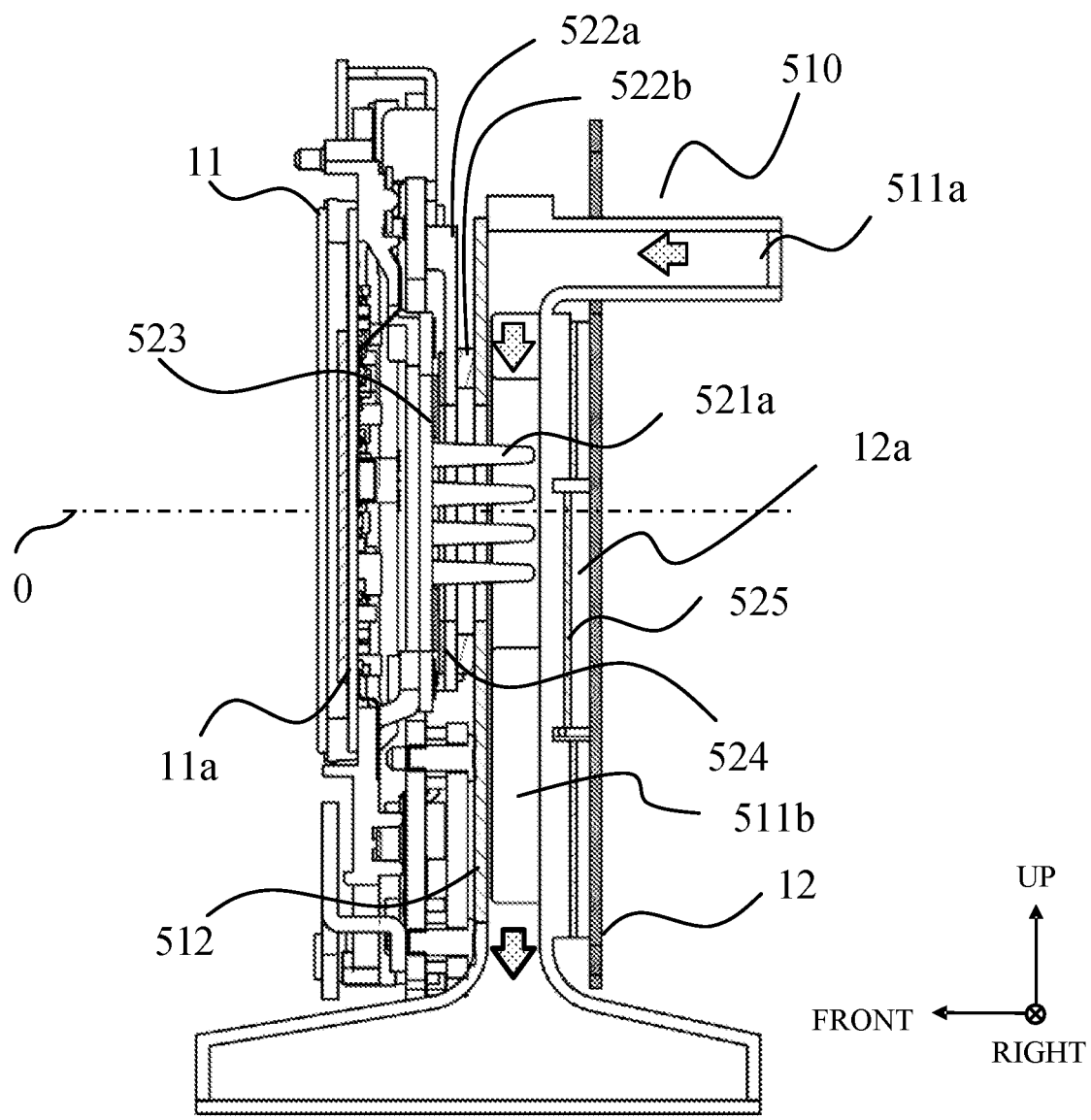
FIG. 4 is a sectional view of an image sensor unit, a duct unit, and the main board in the first embodiment and a fourth embodiment.

Referring now to FIGS. 3A, 3B, and 4, a description will be given of a structure according to this embodiment. FIGS. 3A and 3B are exploded perspective views of the digital camera 500 regarding the image sensor unit 11, the duct unit 510, and the main board 12. FIG. 3A illustrates an exploded perspective view viewed from the main board 12 side and FIG. 3B shows an exploded perspective view viewed from the image sensor unit 11. FIG. 4 is a sectional view including the optical axis O when the image sensor unit 11, the duct unit 510, and the main board 12 are viewed from the left.

The image sensor unit 11 includes a movable unit 11b including an image sensor 11a, and the fixed unit 11c. The movable unit 11b includes an image sensor holder 11d and a heat exchanger 521. The image sensor holder 11d is a metal member that adheres and holds the image sensor 11a. The heat exchanger 521 transfers the heat generated by the image sensor 11a. In this embodiment, the heat exchanger 521 is a metal member having at least one or more cylindrical cooling fins 521a, and is fastened to and thermally connected to the image sensor holder 11d. The material of the heat exchanger 521 may be, but not limited to, a nonmagnetic and lightweight aluminum alloy having an excellent heat transport capacity.

When the digital camera 500 is powered on and the image sensor unit 11 starts to be electrified, the image sensor 11a is driven for imaging and generates the heat according to the power consumption. The heat generated by the image sensor 11a is transferred (heat transfer) to the image sensor holder 11d, and part of the heat is transferred to cooling fins 521a of the heat exchanger 521 which is thermally connected. The duct unit 510 is disposed on the back surface side of the image sensor unit 11. The duct unit 510 includes a duct base 511, a duct cover 512, and a centrifugal fan disposed in the duct base 511. The material of the duct base 511 and the duct cover 512 may be, but not limited to, a nonmagnetic and lightweight aluminum alloy having an excellent heat transfer capacity, like the heat exchanger 521.

An opening 512a is formed in the duct cover 512. The duct base 511 has an inlet port 511a and an outlet port 511d, and cooling fins (heat radiator) 511b formed between them. As illustrated in FIG. 3B, the main board 12 is disposed on the back surface of the duct unit 510. Heat conductive rubbers 525 are disposed between the control ICs 12a mounted on the main board 12 as the heat source and a thermal coupler 511e of the duct base 511.

As illustrated in FIG. 4, the image sensor 11a of the image sensor unit 11, the heat exchanger 521, the duct unit 510, the heat conduction rubbers 525, the control ICs 12a, and the main board 12 are arranged in this order from the front direction. The cooling fins 521a of the heat exchanger 521 movable integrally with the movable unit 11b of the image sensor unit 11 is inserted inside the duct unit 510. Inside the duct unit 510, the flow of air is formed from the inlet port 511a to the outlet port 511d. The cooling fins 521a of the heat exchanger 521 are inserted between the inlet port 511a and the outlet port 511d. The cooling fins 521a are exposed to the airflow in the duct unit 510, so that the heat generated by the image sensor 11a is transferred to the airflow and cooled.

Well-known prior art is a structure that radiates the heat from the movable image sensor unit 11 using a flexible sheet-shaped graphite sheet. However, the graphite sheet has a limited heat transport amount, and the image sensor 11a may not be reliably cooled. On the other hand, this embodiment air-cools the cooling fins 521a of the heat exchanger 521 that moves integrally with the movable unit 11b of the image sensor unit 11, and has a higher cooling capacity of the heat generated by the image sensor 11a than the graphite sheet.

Figure 5:
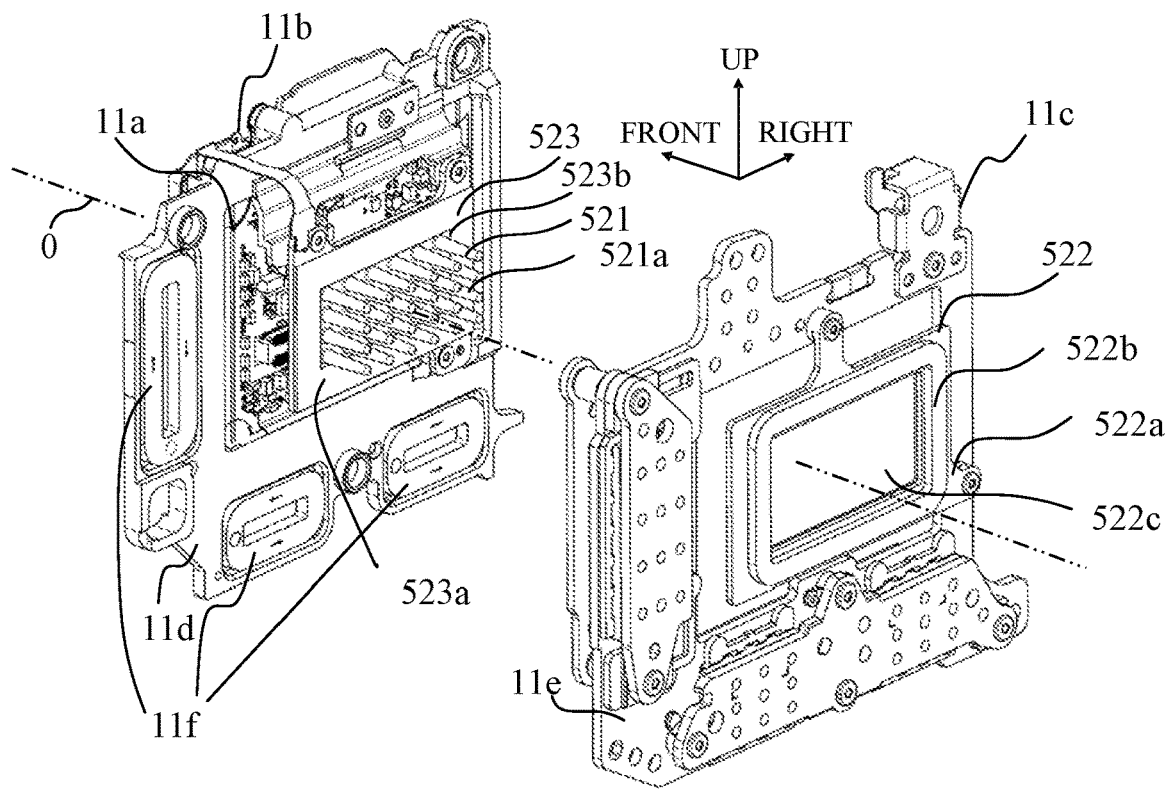
FIG. 5 is an exploded perspective view of an image sensor unit according to the first embodiment.
Figure 6:
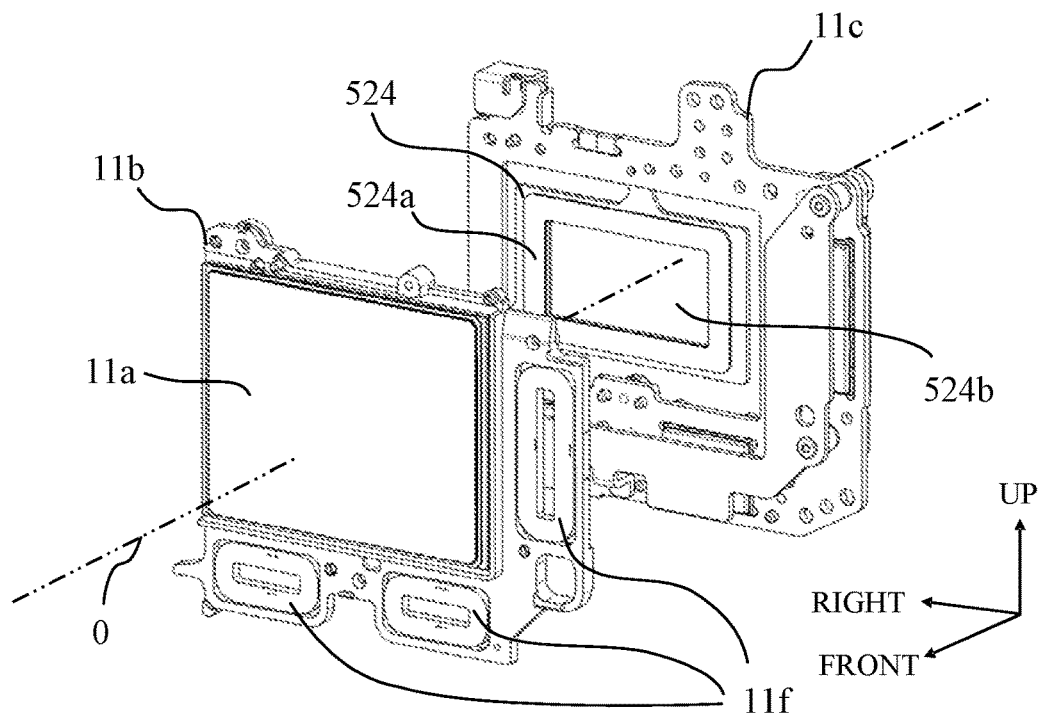
FIG. 6 is an exploded perspective view of an image sensor unit according to the first embodiment.

Referring now to FIGS. 5 and 6, a detailed description will be given of a structure of the image sensor unit 11. FIG. 5 is an exploded perspective view of the movable unit 11b including the image sensor 11a, and the fixed unit 11c constituting the image sensor unit 11 viewed from the rear side. FIG. 6 is an exploded perspective view of FIG. 5 viewed from the reverse direction (front side).

The movable unit 11b is movably (displaceably) supported in a plane direction orthogonal to the optical axis O relative to the fixed unit 11c. When the movable unit 11b is displaced in the direction orthogonal to the optical axis O, an optical image stabilizing function is implemented. The movable unit 11b mainly includes the image sensor 11a, coils 11f for driving the movable unit 11b, the heat exchanger 521, a first shielding member 523, and the image sensor holder 11d. In this embodiment, arrangement of the coils 11f, the wirings appendix, a flexible printed circuits (FPC) substrate and the like, and a driving method of the movable unit 11b are irrelevant, and thus a detailed description thereof will be omitted.

The cooling fins 521a of the heat exchanger 521 extend in a direction opposite to the image sensor 11a, and the first shielding member 523 adhered to and is fixed onto a flat surface portion is provided around the cooling fins 521a in a direction orthogonal to the optical axis 0. The first shielding member 523 is flexible in a direction along the optical axis 0 (optical axis direction), and a surface opposite to the surface fixed to the heat exchanger 521 is a sliding surface 523a and has a surface texture with reduced frictional resistance. The first shielding member 523 has an opening 523b that is open at the center thereof, and is attached to the heat exchanger 521 so that the cooling fins 521a are inserted into the opening 523b.

Next follows a description of the fixed unit 11c. The fixed unit 11c mainly includes a magnet and a yoke for driving the movable unit 11b, a base plate 11e for holding them, a tilt absorber (buffer) 522, and a second shielding member 524 fixed to it. In this embodiment, since the arrangement of the magnet and the yoke is irrelevant, a detailed description thereof will be omitted.

The tilt absorber 522 includes a flexible elastic member 522b, a holding member 522a for holding it, and an opening 522c at the center of the holding member 522a, and the elastic member 522b is disposed so as to surround the periphery of the opening 522c. The second shielding member 524 is in close contact with and fixed to a surface opposite to the elastic member 522b of the tilt absorber 522, and is disposed so that a sliding surface 524a having a surface texture with reduced frictional resistance, and the sliding surface 523a of the shielding member 523 on the movable unit 11b are opposite to each other. At this time, the first flexible shielding member 523 is attached by the second shielding member 524, pressed in the direction along the optical axis 0, and elastically deformed by a predetermined amount. Thereby, the sliding surfaces 523a and 524a are in close contact with each other, and can prevent water droplets and dust from entering between them.

An opening (second opening) 524b is formed at the center of the second shielding member 524, and the cooling fins 521a are attached so as to perforate (penetrate) through the opening 524b. The opening 524b has a shape that avoids collisions with the cooling fins 521a in a range in which the movable unit 11b is moved in a plane orthogonal to the optical axis 0 relative to the fixed unit 11c. An outer shape of the first shielding member 523 is set larger than an opening 524b so that a portion that does not overlap the opening 524b of the second shielding member 524 in the direction along the optical axis 0 is not formed within the moving range of the movable unit 11b.

As illustrated in FIG. 2, when the image sensor unit 11 is fixed and assembled to the front base 22 via a base plate 11e, its attachment height is adjusted while the imaging plane of the image sensor 11a is located at a predetermined optical distance from the mount 26. At that time, the base plate 11e is fixed to the front base 22 so that its tilt is adjusted such that the tilt between the imaging plane and the mount 26 has a parallelism equal to or smaller than a predetermined value. The tilt of the tilt adjuster 522 constituting the image sensor unit 11 is also adjusted in the same manner, but the elastic member 522b having flexibility in the direction along the optical axis 0 is elastically deformed relative to and in close contact with the duct cover 512. Thereby, the space inside the duct unit 510 and the space inside the digital camera 500 are shielded from each other.

Figure 7B:
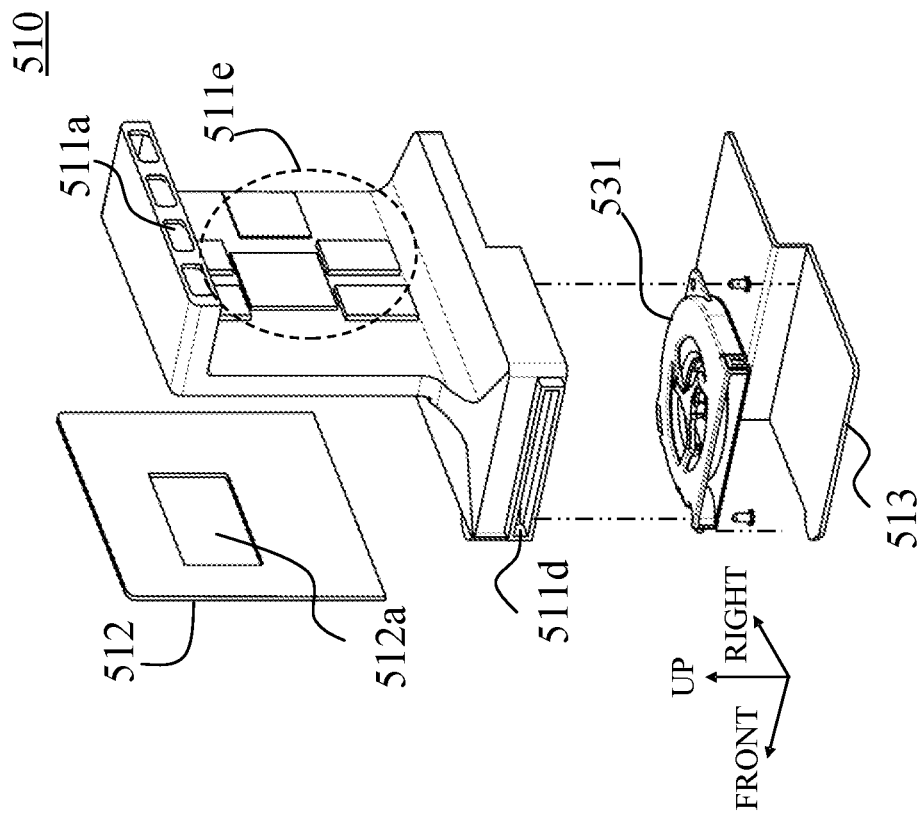
FIGS. 7A and 7B are exploded perspective views of a duct unit according to the first embodiment.
Figure 7A:
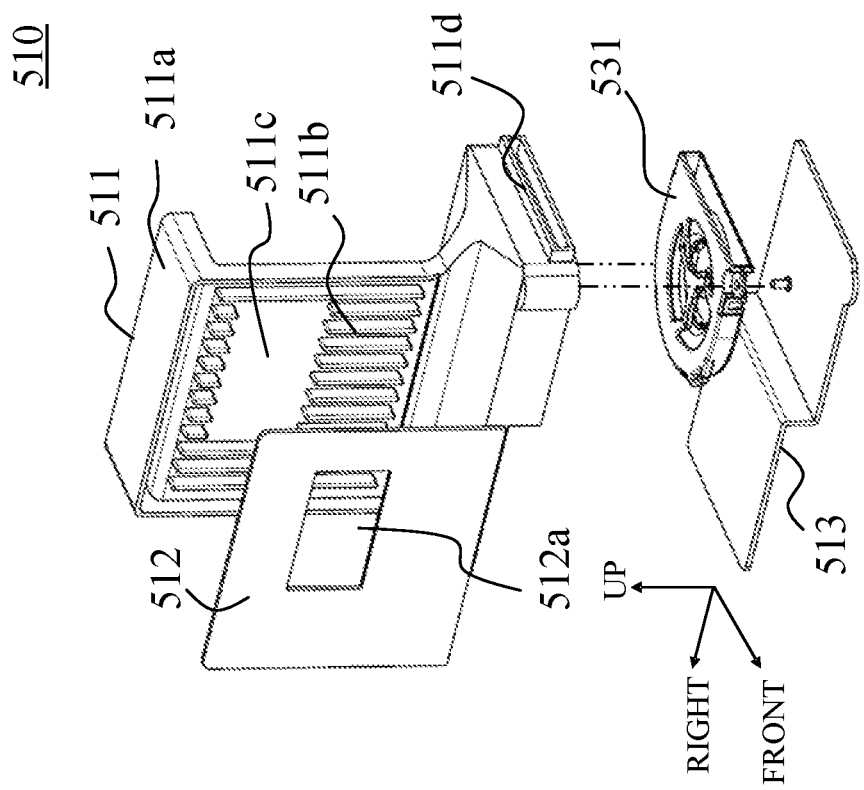

Referring now to FIGS. 7A and 7B, a description will be given of the structure of the duct unit 510 according to this embodiment. FIG. 7A is an exploded perspective view of the duct unit 510 viewed from the image sensor unit 11 side. FIG. 7B is an exploded perspective view of the duct unit 510 viewed from the main board 12 side. In FIGS. 7A and 7B, the duct unit 510 forms part of the air channel (flow path) by the duct base 511 and the duct cover 512. A centrifugal fan 531 for forcibly creating the flow of air is disposed on the bottom surface side, screwed to the duct base 511, and covered with the duct bottom cover 513. The inside of the duct unit 510 and the inside of the digital camera 500 are separated, and the air that enters the inside of the duct unit 510 is unlikely to enter the inside of the digital camera 500.

Figure 8:
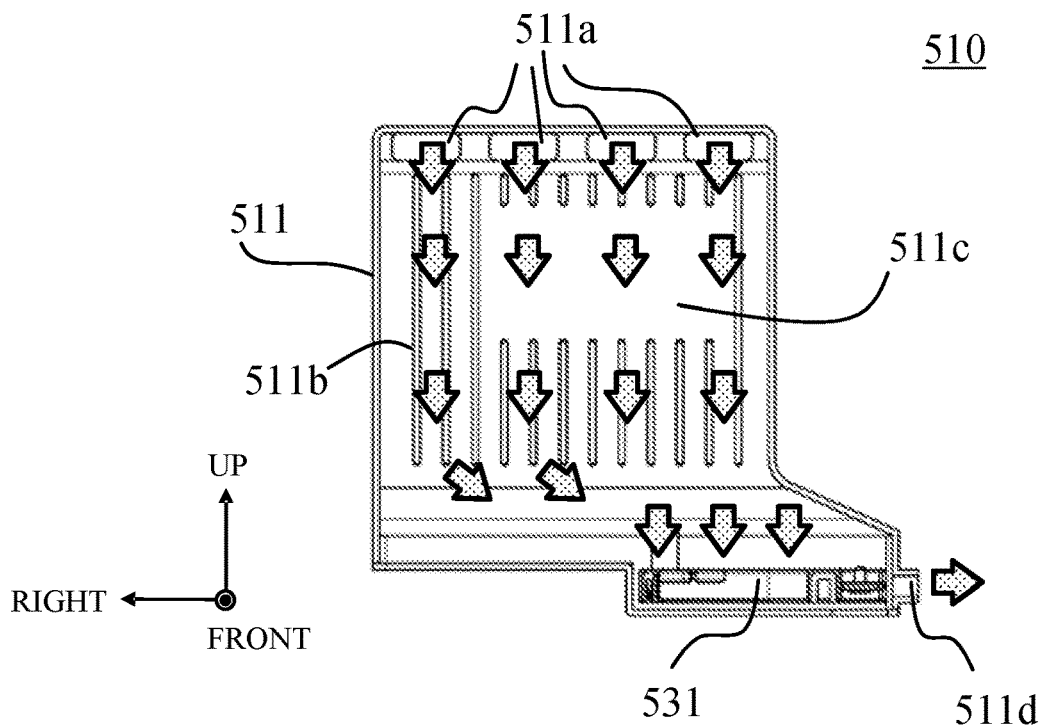
FIG. 8 is an internal structure diagram of a duct unit according to the first embodiment.

Referring now to FIGS. 7A, 7B, and 8, a description will be given of the flow of air inside the duct unit 510. FIG. 8 is an internal structure diagram of the duct unit 510 without the duct cover 512 of the duct unit 510.

The duct base 511 has an inlet port 511a as an air inlet, and an outlet port 511d for exhausting air. The centrifugal fan 531 is disposed near the outlet port 511d of the duct base 511, and forcibly creates the flow of air. Each arrow in FIG. 8 indicates the flow of air. Cooling fins 511b are formed in the air channel between the inlet port 511a and the outlet port 511d to promote cooling of the duct base 511 by bringing the surface of the duct base 511 into contact with more air. The cooling fins 511b of the duct base 511 form a plurality of ribs extending along the flow of air inside the duct unit 510, and protruding from the duct base 511 to the duct cover 512 (from the main board 12 to the image sensor unit 11).

The duct cover 512 has an opening 512a. As described above, the cooling fins 521a of the heat exchanger 521 on the image sensor unit 11 side are inserted into the opening 512a. Each cooling fin 521a of the heat exchanger 521 on the image sensor unit 11 side is thermally coupled to the movable unit 11b and integrally movable. Therefore, the opening 512a is opened to the extent that does not collide with the cooling fins 521a in a moving range of the movable unit 11b in the plane orthogonal to the optical axis 0. When projected on a plane in the direction along the optical axis 0, the opening 512a of the duct cover 512 overlaps an area of a cooling finless portion 511c, which has no cooling fins 511b of the duct base 511.

As illustrated in FIG. 7B, formed on the surface of the duct base 511 on the main board 12 side is a thermal coupler 511e that is thermally coupled to the control ICs 12a as the heat source of the main board 12 via a heat conductive rubber or the like. A description will now be given of the cooling structure of the duct unit 510 for cooling the heat generated by the control ICs 12a as the heat source of the main board 12. The heat generated by the control ICs 12a as the heat source of the main board 12 is transferred to the duct base 511 via the thermal coupler 511e and the thermal conductive rubber. Next, each cooling fin 511b of the duct base 511 that has received the heat contacts the airflow generated by driving the centrifugal fan 531 inside the duct unit 510 and is cooled. Thus, the duct unit 510 has a cooling structure using the airflow inside the duct unit 510, and constantly transfers the heat generated by the control ICs 12a as the heat source in the main board 12 to the cooling fins 511b.

As described above, the duct base 511 includes the thermal coupler 511e corresponding to the control ICs 12a as the heat source in the main board 12, and the cooling fins 511b on the surface of the air channel side. When projected on the plane in the optical axis direction, the area where the cooling fins 511b are formed is located does not overlap the area into which the cooling fins 521a on the image sensor unit 11 side are inserted. Since the cooling fins 521a on the image sensor unit 11 side are movable, the cooling fins 511b of the duct base 511 are formed in an area other than the movable area.

The heat generated by the control ICs 12a on the main board 12 side and the heat generated by the image sensor unit 11 are transferred to the cooling fins 521a and the cooling fins 511b, which are thermally coupled to them. The cooling fins 521a of the image sensor unit 11 and the cooling fins 511b of the duct unit 510 constantly and continuously contact the airflow generated inside the duct unit 510. When the cooling fins 521a and the cooling fins 511b constantly contact the cooling air, it is possible to simultaneously suppress the temperature rises of both the image sensor unit 11 and the control ICs 12a in the main board 12 as the heat sources.

Figure 9:
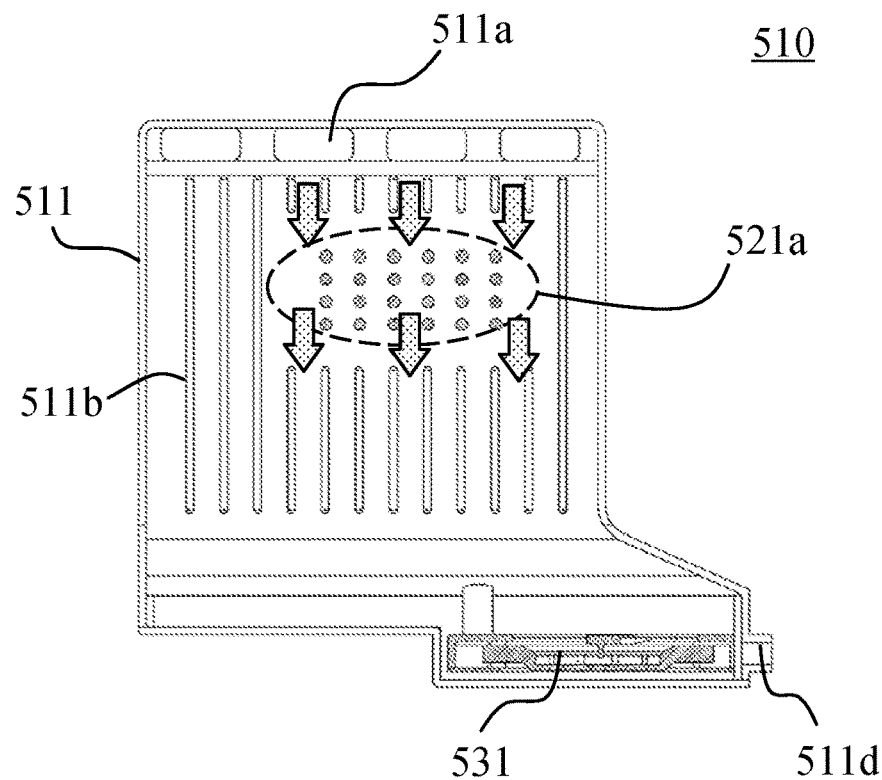
FIG. 9 is an internal structure diagram of a duct unit according to the first embodiment.

Referring now to FIG. 9, a description will be given of a shape of the cooling fin 521a of the heat exchanger 521 that is integrally movable and thermally coupled to the movable unit 11b in the image sensor unit 11. FIG. 9 is an internal structure diagram of the duct unit 510, in a state where the cooling fins 521a of the heat exchanger 521 of the image sensor unit 11 are disposed inside the duct unit 510.

Generally, the cooling capacity of a cooling structure member such as the duct base 511 increases as the air contact surface area becomes wider. Each cooling fins 511b formed on the duct base 511 is disposed between the inlet port 511a and the outlet port 511d, and has a rib shape that does not obstruct the flow of air. The cooling fin 511b has a rib shape to make the air contact surface area as wide as possible.

In this embodiment, each cooling fin 521a of the heat exchanger 521 that is thermally coupled to the image sensor unit 11 is inserted inside the duct unit 510. As illustrated in FIGS. 5 and 9, the cooling fins 521a of the heat exchanger 521 in this embodiment have a plurality of substantially cylindrical shapes. The cooling fin 521a of the heat exchanger 521 is integrally movable with the movable unit portion 11b of the image sensor unit 11. Therefore, in a case where the movable unit 11b is formed to have the same rib shape as that of the cooling fin 511b inside the duct unit 510, the flow of air inside the duct unit 510 may be obstructed depending on the position when the movable unit 11b is moved. The movable unit 11b of the image pickup apparatus 11 is particularly rotated as well as translated, in a case where it has a rib shape similar to that of the cooling fin 511b, the flow of air may be further obstructed.

If the movable unit 11b is moved against the flow of air, the movable load increases, which may negatively affect or disable the image stabilizing function. Forming the cooling fin 521a of the heat exchanger 521 into a substantially cylindrical shape can eliminate scattering of the load due to the movement of the movable unit 11b and maintain the load always constant. Accurate image stabilization is always available by always moving the movable unit 11b with a constant load.

In this embodiment, as illustrated in FIGS. 4, 7A, and 7B, the first shielding member 523, the second shielding member 524, and the opening 512a of the duct cover 512 are arranged in this order from the front direction between the inlet port 511a and the centrifugal fan 531 inside the duct unit 510. This structure can utilize the negative pressure generated in a direction of pressing the first shielding member 523 against the second shielding member 524 by the airflow inside the duct unit 510 generated by driving the centrifugal fan 531. When the first shielding member 523 is pressed against the second shielding member 524, the adhesion is increased, which prevents water droplets and dust from entering between them.

In one modification of this embodiment, the second shielding member 524, the first shielding member 523, and the opening 512a of the duct cover 512 may be arranged in this order from the front side between the outlet port 511d and the centrifugal fan 531 inside the duct unit 510. This structure can utilize the positive pressure generated in a direction of pressing the first shielding member 523 against the second shielding member 524 by the airflow inside the duct unit 510 generated by driving the centrifugal fan 531.

In another modification of this embodiment, the second shielding member 524 may be omitted, and the tilt adjuster 522 or the duct cover 512 and the first shielding member 523 may be slidable relative to each other.

Second Embodiment

Figure 10:
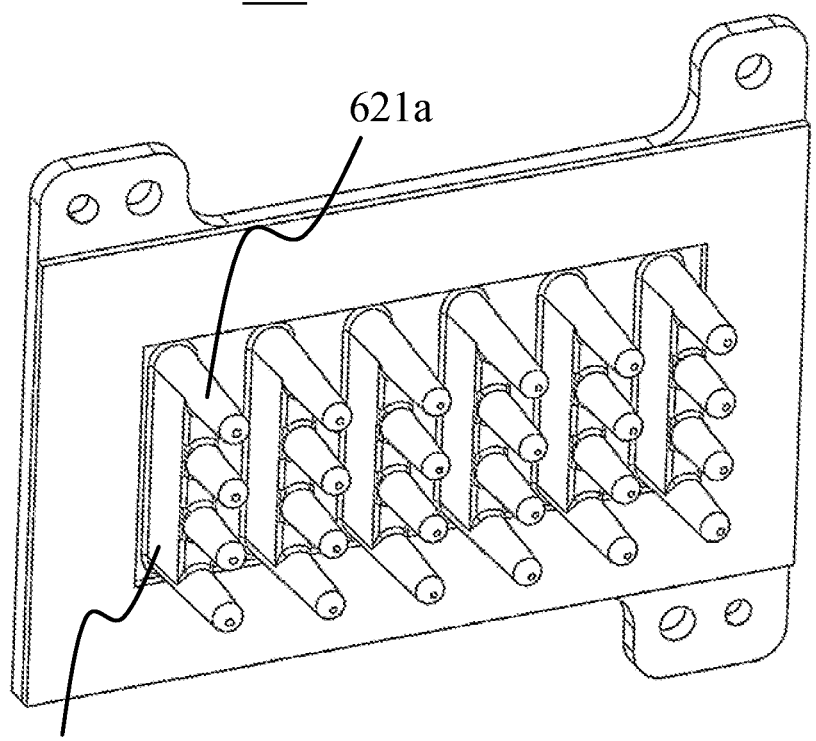
FIG. 10 is a perspective view of a heat exchanger according to a second embodiment.
Figure 11:
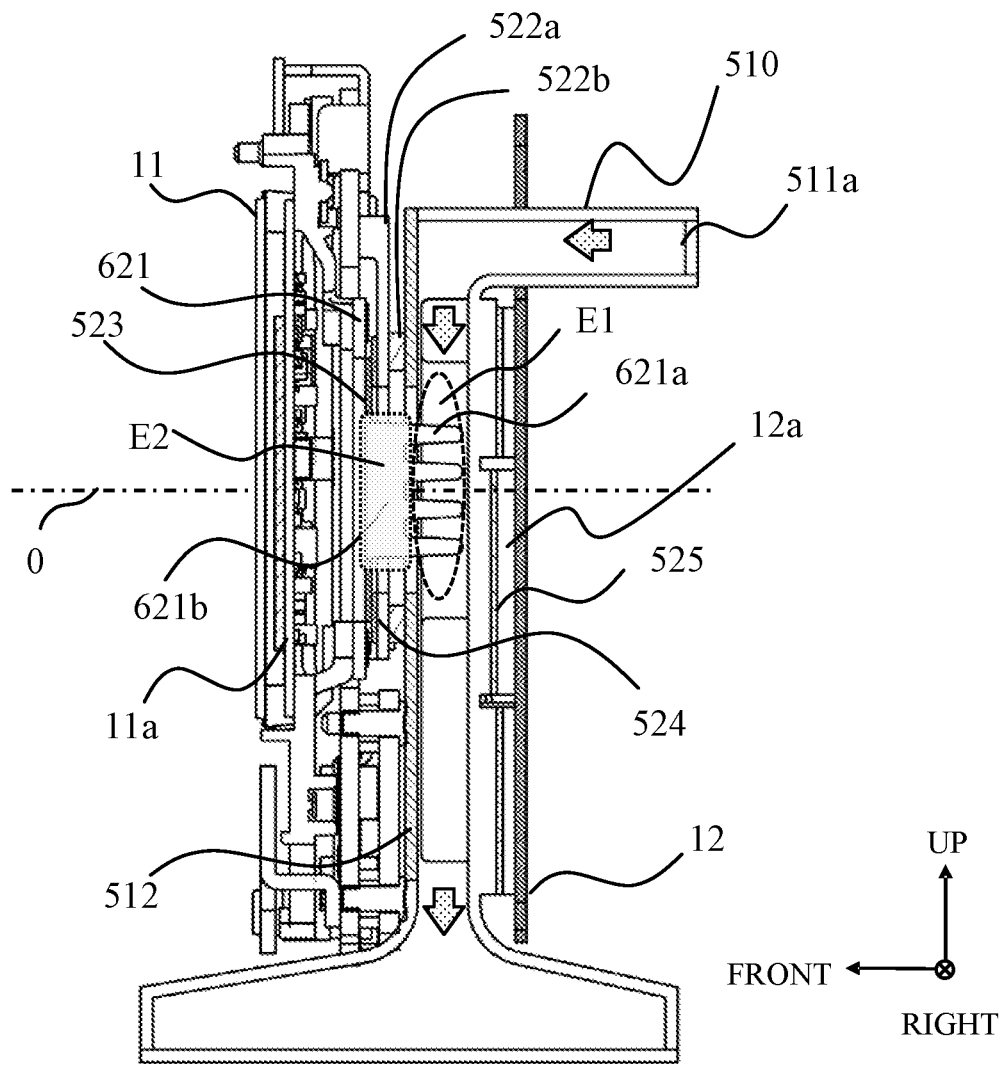
FIG. 11 is a sectional view of an image sensor unit, a duct unit, and a main board in the second embodiment.

Referring now to FIGS. 10 and 11, a description will be given of a second embodiment of the present invention. FIG. 10 is a perspective view of a heat exchanger 621 according to this embodiment. FIG. 11 is a sectional view of the image sensor unit 11, the duct unit 510, and the main board 12 in this embodiment.

The heat exchanger 621 is movable integrally with the movable unit 11b of the image sensor unit 11 in the same manner as the heat exchanger 521 in the first embodiment. As illustrated in FIGS. 10 and 11, a cooling fin 621a of the heat exchanger 621 of the image sensor unit 11 has a substantially cylindrical shape in an insertion range E1 inside the duct unit 510. However, in a range E2 not inserted into the duct unit 510, a substantially cylindrical shape is connected to form a cooling rib shape portion 621b. As described above, the cooling fin 621a has a higher cooling capacity as the air contact surface area becomes wider. The cooling rib shape portion 621b in the range E2 not inserted into the duct unit 510 increases the total volume of the heat exchanger 621 without obstructing the flow of air inside the duct unit 510. As the heat capacity increases accordingly, the cooling capacity increases.

Third Embodiment

Figure 12A:
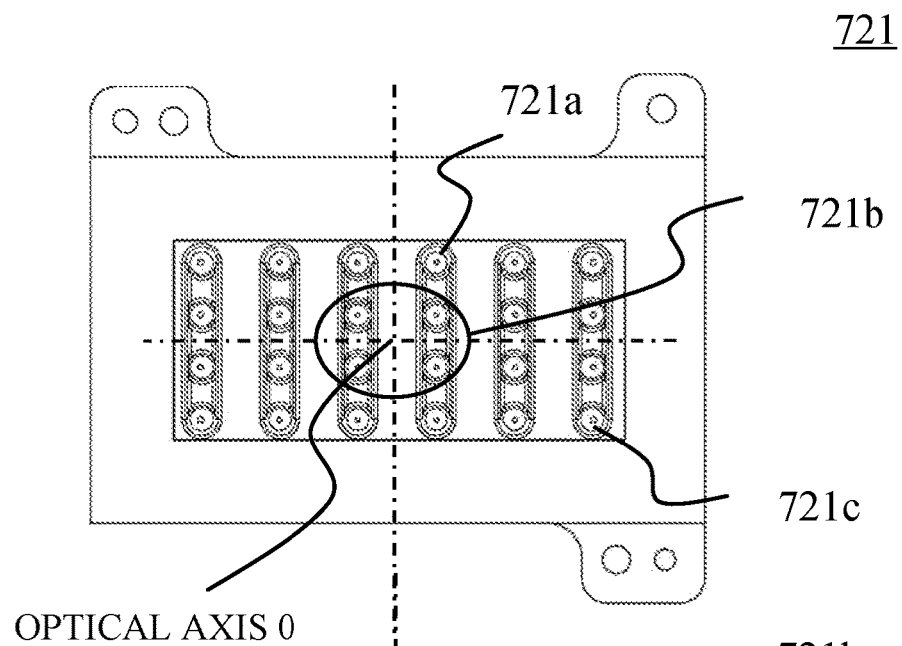
FIGS. 12A and 12B are structural diagrams of a heat exchanger according to a third embodiment.
Figure 12B:
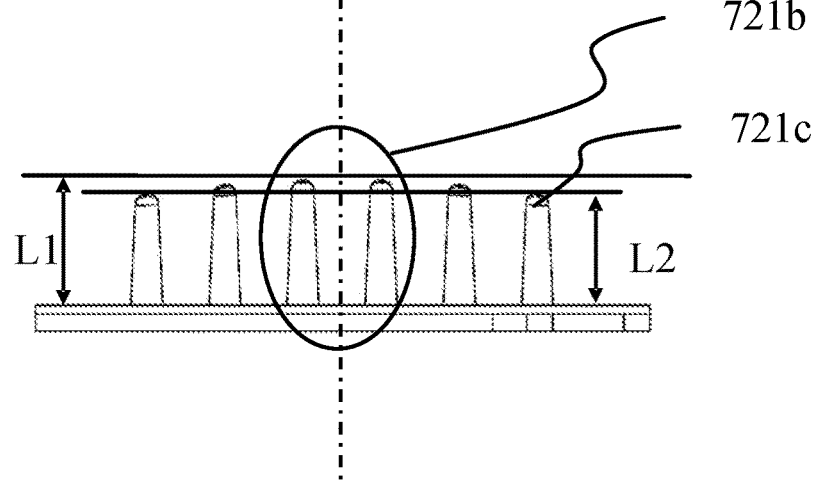

Referring now to FIGS. 12A and 12B, a description will be given of a third embodiment of the present invention. FIGS. 12A and 12B are structural diagrams of a heat exchanger 721 according to this embodiment.

The heat exchanger 721 is driven integrally with the movable unit 11b of the image sensor unit 11 in the same manner as the heat exchanger of each of the preceding embodiments. Each cooling fin 721a of the heat exchanger 721 has an approximately cylindrical shape in which cooling fins 721b located near the center of the optical axis 0 extend closest to the duct unit 510, and become lower as a position is distant from the center of the optical axis 0.

As illustrated in FIG. 12B, the heat exchanger 721 has a length (first length) L1 of the cooling fin 721b extending highest near the optical axis 0, and a length (second length) L2 of the cooling fin 721c having the shortest length at the most distant position from the optical axis 0. That is, the heat exchanger 721 has a first length in the optical axis direction in a first area including the optical axis 0, and a second length in the optical axis in a second area distant from the optical axis 0 than the first area, and the first length is longer than the second length.

Similar to the assembly of the image sensor unit 11, the heat exchanger 721 is also assembled in a tilted state. When the image sensor unit 11 is fixed while its tilt is adjusted, the cooling fins 721a also tilt. In the structure in which the cooling fins 721a are inserted inside the duct unit 510, the image sensor unit 11 is assembled while its tilt is adjusted, but the duct unit 510 is not tilted. Therefore, part of the cooling fins 721a may interfere with the duct base 511 of the duct unit 510. On the other hand, the cooling fins 721a in this embodiment, the cooling fins 721b extend most toward the duct unit 510 side near the optical axis 0, and the cooling fins 721c become lower at positions separated from the optical axis 0. This structure can prevent interference with the dust base 511, even if the tilt is adjusted and fixed.

Fourth Embodiment

Referring now to FIGS. 4, 13A, and 13B, a description will be given of a fourth embodiment of the present invention. This embodiment will discuss the shapes of the first shielding member 523 and the second shielding member 524. FIGS. 13A to 13D are structural diagrams of the heat exchanger 521, the cooling fin 521a, the first shielding member 523, and the second shielding member 524 in this embodiment along the optical axis 0 from the duct unit 510 side. In FIGS. 13A to 13D, other structures are omitted for simplicity purposes. In FIGS. 13A to 13D, an area of the first shielding member 523 overlapping the second shielding member 524 is illustrated as an overlap portion 523c.

As illustrated in FIG. 13A, a central axis 11g of the image sensor 11a coincides with the optical axis 0 when the digital camera 500 is stationary and the movable unit 11b is electrified without any external blurring. When an external shake is applied to this state, the movable unit 11b is controlled to move in a plane direction orthogonal to the optical axis 0 relative to the fixed unit 11c for the image stabilization. Since a frictional force is generated in the sliding portion of the first shielding member 523 and the second shielding member 524, it is necessary to suppress the power consumption against the frictional force as small as possible. It is therefore desired to reduce the sliding area between the first shielding member 523 and the second shielding member 524, that is, the area of the overlap portion 523c.

FIG. 13B illustrates a state when the movable unit 11b is driven relative to the fixed unit 11c in the translational direction and the rotation direction as indicated by arrows for the image stabilization. At that time, the central axis 11g of the image sensor 11a is moved from the optical axis 0, and the image sensor 11a is rotated around the central axis 11g. The cooling fins 521a are also rotated around the central axis 11g at the same time, but the moving range becomes larger of the cooling fins 521a due to the rotation as the cooling fin 521a is moved farther from the central axis 11g of the image sensor 11a.

Accordingly, in this embodiment, as illustrated in FIG. 13A, the central axis 521b of the cooling fin 521a in the plane direction orthogonal to the optical axis 0 is disposed so as to coincide with the central axis 11g of the image sensor 11a. This arrangement can reduce the moving range of the cooling fin 521a even when the movable unit 11b is driven in the translational and rotational directions as illustrated by the arrows relative to the fixed unit 11c. That is, it is possible to reduce the area of the opening 524b of the second shielding member 524 in order to avoid the moving range of the cooling fin 521a. The shape of the opening 524b of the shielding member 524 may be substantially circular as illustrated in FIGS. 13A and 13B. This makes it possible to further reduce the area of the opening 524b for avoiding the cooling fin 521a against the movement of the movable unit 11b. If the area of the opening 524b can be made small, the outer shape of the first shielding member 523 can be made small, and the sliding area between the first shielding member 523 and the second shielding member 524 can be reduced.

As illustrated in FIGS. 13C and 13D, the outer shape of the first shielding member 523 may be similar to the opening 524b of the second shielding member 524. Thereby, when the movable unit 11b is driven, the sliding area between the first shielding member 523 and the second shielding member 524, that is, the overlap portion 523c can be further reduced.

As described above, in each embodiment, the image pickup apparatus (digital camera 500) includes the image sensor unit 11 having the fixed unit 11c and the movable unit 11b movable relative to the fixed unit, and the duct unit 510 that forms an air channel. The movable unit includes an image sensor 11a and a heat exchanger 521 (621, 721). At least part of the heat exchanger is inserted inside of the duct unit through the opening 512a of the duct unit.

The movable unit may include a first shielding member 523. The first shielding member seals the channel from the internal space to the external space (a space in which the image sensor unit 11 is located) of the duct unit at the opening of the duct unit. The first shielding member may surround the heat exchanger and seal the channel from the internal space to the external space of the duct unit even where the movable unit is moved. The first shielding member may include a circular shape (approximately circular shape). The fixed unit may include a second shielding member (524) that slides relative to the first shielding member and seals the channel from the internal space to the external space of the duct unit at the opening of the duct unit. The second shielding member may include a second opening (opening 524b) through which the heat exchanger penetrates, and the second opening is circular (approximately circular).

The fixed unit may include a buffer (tilt absorber 522) having an elastic member (522b) that seals the channel from the internal space to the external space of the duct unit. The elastic member is pressed against the duct unit while surrounding the periphery of the heat exchanger, thereby sealing the channel from the internal space to the external space of the duct unit. The image pickup apparatus may include the main board 12 that includes the controller (control ICs 12a). At least part of the duct unit overlaps each of the image sensor unit and the main board in the optical axis direction, and is disposed between the image sensor unit and the main board. The duct unit may include a heat radiator (cooling fins 511b). The heat radiator includes a plurality of rib shapes extending along the airflow in the internal space of the duct unit, which protrudes from the main board toward the image sensor unit. The heat radiator may be disposed outside the movable range of the heat exchanger.

At least part (cooling fins 521a) of the heat exchanger inserted inside the duct unit may include a cylindrical shape (substantially cylindrical shape). Among the heat exchangers 621, at least part of the heat exchanger (cooling rib shape portion 621b) that is not inserted inside the duct unit may have a rib shape extending along the airflow in the internal space of the duct unit.

Each embodiment can provide an image pickup apparatus that can radiate heat generated by an image sensor movable in a direction orthogonal to the optical axis.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-037727, filed on Mar. 9, 2021, which is hereby incorporated by reference herein in its entirety.

What is claimed is:

1. An image pickup apparatus comprising:
   an image sensor unit that includes a fixed unit and a movable unit movable relative to the fixed unit; and
   a duct unit configured to form an air channel,
   wherein the movable unit includes an image sensor and a heat exchanger, and
   wherein at least part of the heat exchanger is inserted inside the duct unit through an opening of the duct unit.

2. The image pickup apparatus according to claim 1, wherein the heat exchanger transfers heat generated by the image sensor.

3. The image pickup apparatus according to claim 1, wherein the movable unit includes a first shielding member, and
   wherein the first shielding member seals a channel from an internal space to an external space of the duct unit at the opening of the duct unit.

4. The image pickup apparatus according to claim 3, wherein the first shielding member surrounds the heat exchanger and seals the channel from the internal space to the external space of the duct unit even where the movable unit is moved.

5. The image pickup apparatus according to claim 3, wherein the first shielding member has a circular shape.

6. The image pickup apparatus according to claim 3, wherein the fixed unit includes a second shielding member configured to slide relative to the first shielding member and to seal the channel from the internal space to the external space of the duct unit at the opening of the duct unit.

7. The image pickup apparatus according to claim 6, wherein the second shielding member has a second opening through which the heat exchanger perforates, and
   wherein the second opening has a circular shape.

8. The image pickup apparatus according to claim 1, wherein the fixed unit includes a buffer that includes an elastic member configured to seal a channel from an internal space to an external space of the duct unit, and
   wherein the elastic member is pressed against the duct unit while surrounding a periphery of the heat exchanger, and thereby seals the channel from the internal space to the external space of the duct unit.

9. The image pickup apparatus according to claim 1, further comprising a main board that includes a controller,
   wherein at least part of the duct unit overlaps each of the image sensor unit and the main board in an optical axis direction, and is disposed between the image sensor unit and the main board.

10. The image pickup apparatus according to claim 9, wherein the duct unit includes a heat radiator,
    wherein the heat radiator has a plurality of rib shapes extending along an airflow in the internal space of the duct unit, and protruding from the main board to the image sensor unit, and
    wherein the heat radiator is disposed outside a movable range of the heat exchanger.

11. The image pickup apparatus according to claim 1, wherein at least part of the heat exchanger inserted inside the duct unit has a cylindrical shape.

12. The image pickup apparatus according to claim 1, wherein at least part of the heat exchanger that is not inserted inside the duct unit has a rib shape extending along an airflow in the internal space of the duct unit.

13. The image pickup apparatus according to claim 1, wherein the heat exchanger has a first length in an optical axis direction in a first area including an optical axis, and a second length in the optical axis direction in a second area more distant from the optical axis than the first area, and
    wherein the first length is longer than the second length.

14. The image pickup apparatus according to claim 1, wherein the movable unit is movable in a direction orthogonal to an optical axis for an image stabilization.

* * * * *